(12) United States Patent
Youn et al.

(10) Patent No.: US 12,025,652 B2
(45) Date of Patent: Jul. 2, 2024

(54) APPARATUS AND METHOD FOR INSPECTING SEMICONDUCTOR

(71) Applicant: Samsung Electronics Co., Ltd., Suwon-si (KR)

(72) Inventors: Mi-Sol Youn, Cheonan-si (KR); Min Kim, Cheonan-si (KR); Kyoung Woon Min, Cheonan-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 16 days.

(21) Appl. No.: 17/853,079

(22) Filed: Jun. 29, 2022

(65) Prior Publication Data
US 2023/0048997 A1 Feb. 16, 2023

(30) Foreign Application Priority Data
Aug. 11, 2021 (KR) .................. 10-2021-0105879

(51) Int. Cl.
*G01R 31/28* (2006.01)
(52) U.S. Cl.
CPC ..... *G01R 31/2817* (2013.01); *G01R 31/2889* (2013.01)
(58) Field of Classification Search
None
See application file for complete search history.

(56) References Cited

U.S. PATENT DOCUMENTS

| | | | | |
|---|---|---|---|---|
| 2002/0043893 A1* | 4/2002 | Puskas | ............ | B08B 3/12 310/317 |
| 2005/0017599 A1* | 1/2005 | Puskas | ............ | B06B 1/0618 310/317 |
| 2008/0129146 A1* | 6/2008 | Puskas | ............ | B06B 1/0284 310/317 |
| 2017/0176397 A1* | 6/2017 | Oono | ............ | G01N 29/2487 |
| 2019/0013218 A1* | 1/2019 | Park | ............ | H01L 21/02052 |
| 2019/0271734 A1* | 9/2019 | Matsumoto | ......... | G01R 31/303 |

FOREIGN PATENT DOCUMENTS

| | | |
|---|---|---|
| CN | 110126125 A | 8/2019 |
| JP | 4716524 B2 | 7/2011 |
| KR | 100784957 B1 | 12/2007 |
| KR | 101473104 B1 | 12/2014 |
| KR | 101625948 B1 | 5/2016 |
| KR | 101799302 B1 | 12/2017 |
| KR | 101950569 B1 | 2/2019 |

* cited by examiner

*Primary Examiner* — Jermele M Hollington
*Assistant Examiner* — Suresh K Rajaputra
(74) *Attorney, Agent, or Firm* — Harness, Dickey & Pierce, P.L.C.

(57) ABSTRACT

An apparatus and a method for inspecting a semiconductor includes a water tank which includes a housing, an interior of which is filled with a liquid, and a support block which provides a settling surface for an inspection object inside the housing. A plurality of signal generators are installed on a bottom surface of the housing, and output a frequency signal in a direction in which the inspection object is located. A power supply operates the signal generators. A probe is placed above the inspection object, and a receiver which operates with the probe and is attached to a bottom surface of the support block. Foreign matter remaining on the inspection object are removed, using a plurality of frequency signals which are output by the plurality of signal generating units.

20 Claims, 13 Drawing Sheets

[FIG. 1]
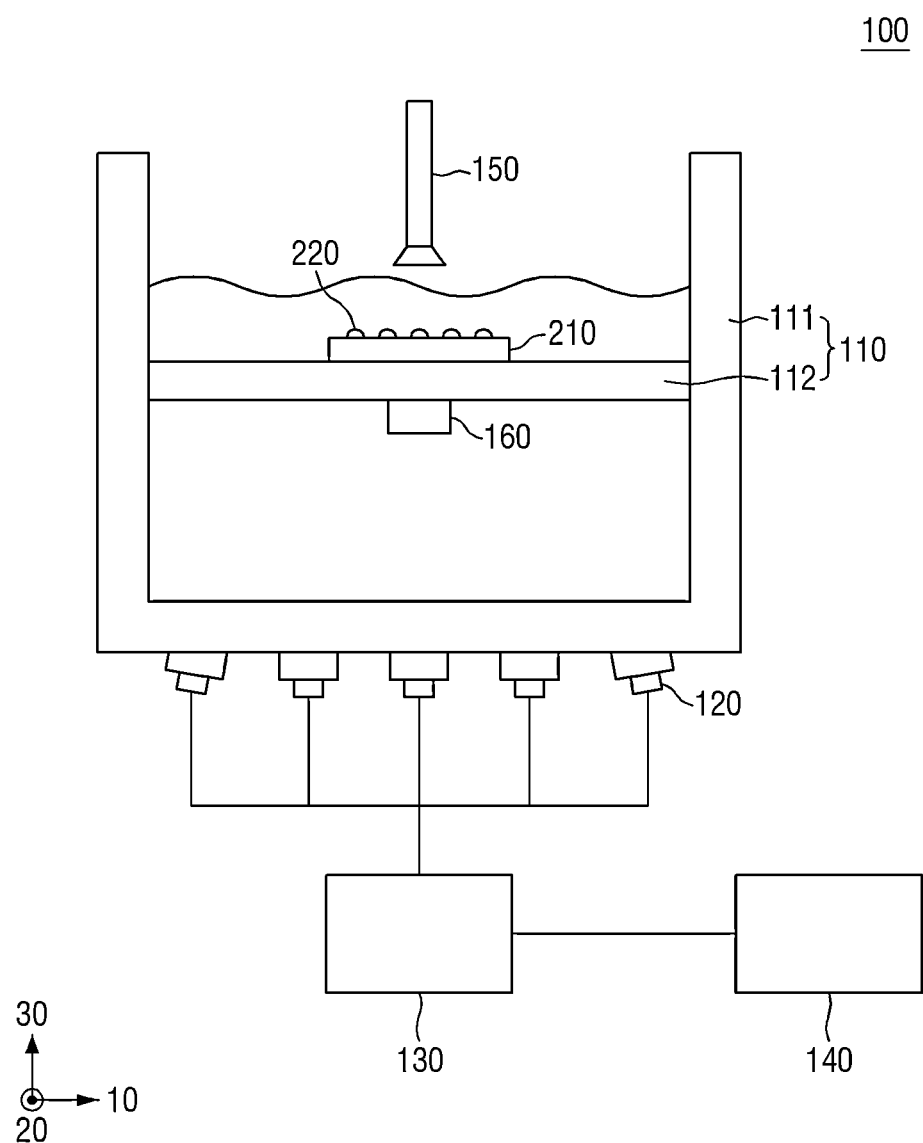

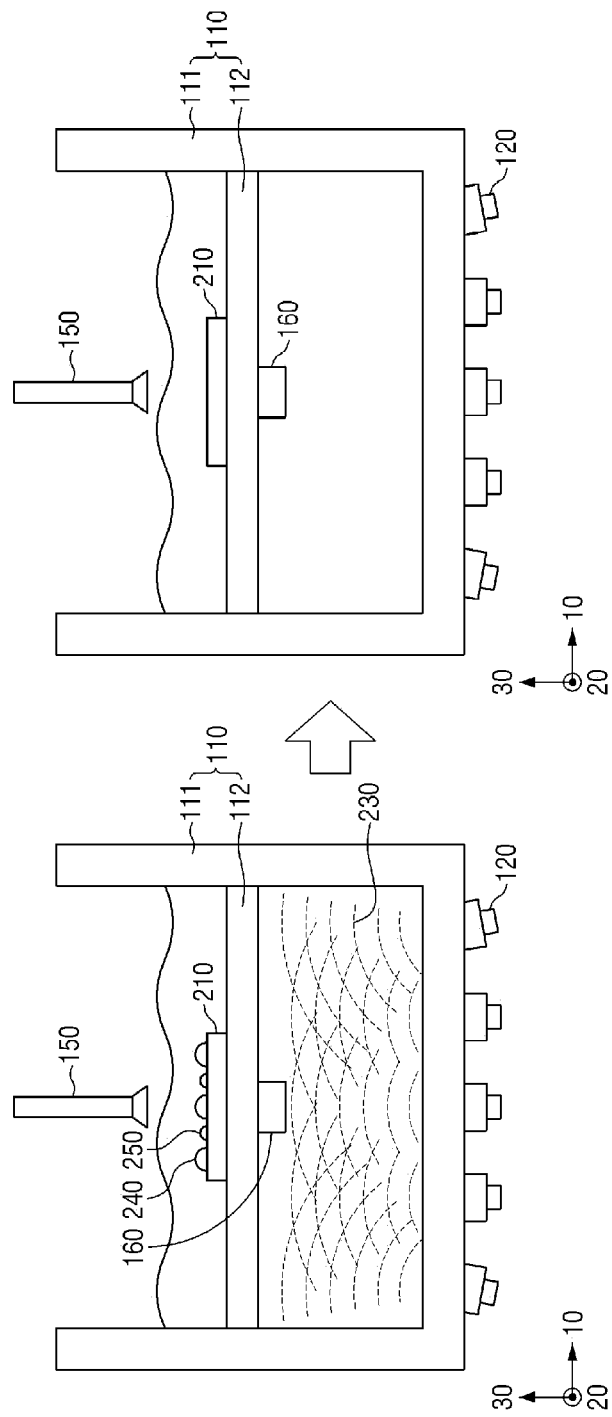
[FIG. 2]

[FIG. 3]
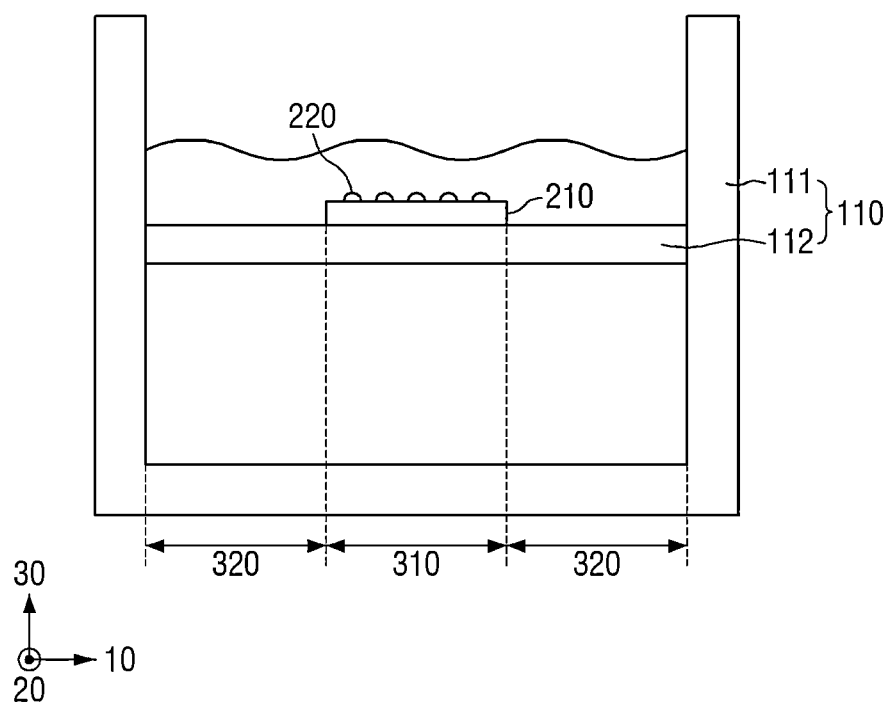

[FIG. 4]
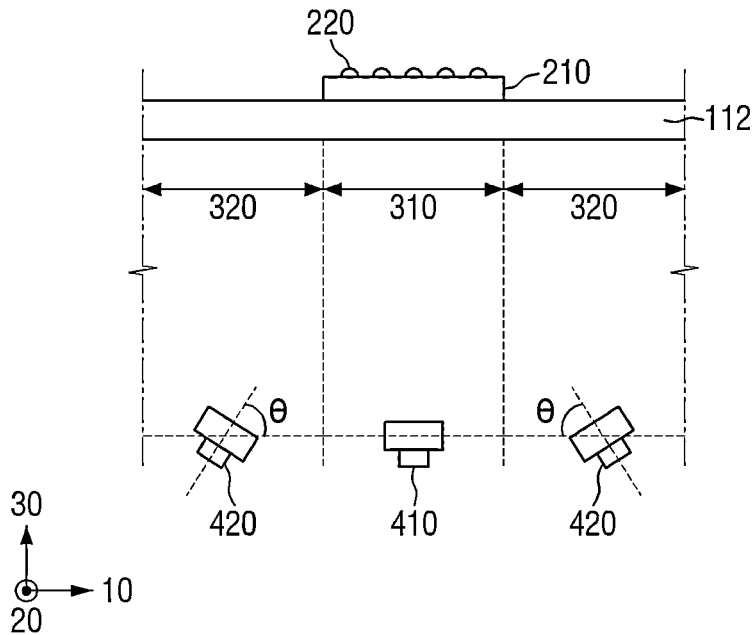
[FIG. 5]
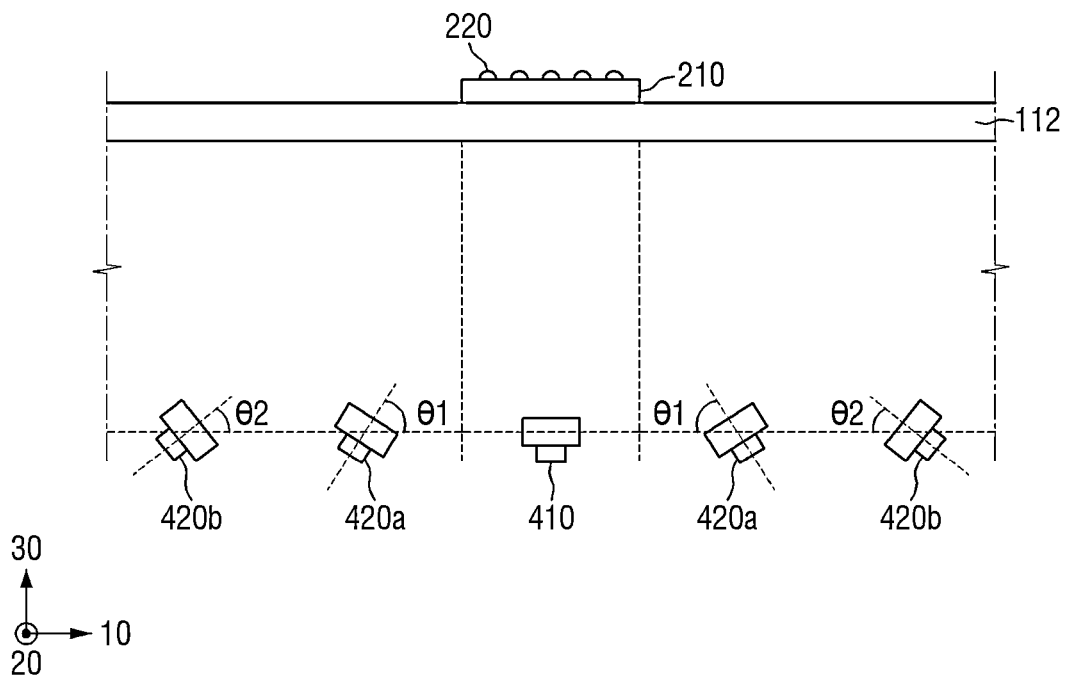

[FIG. 6]
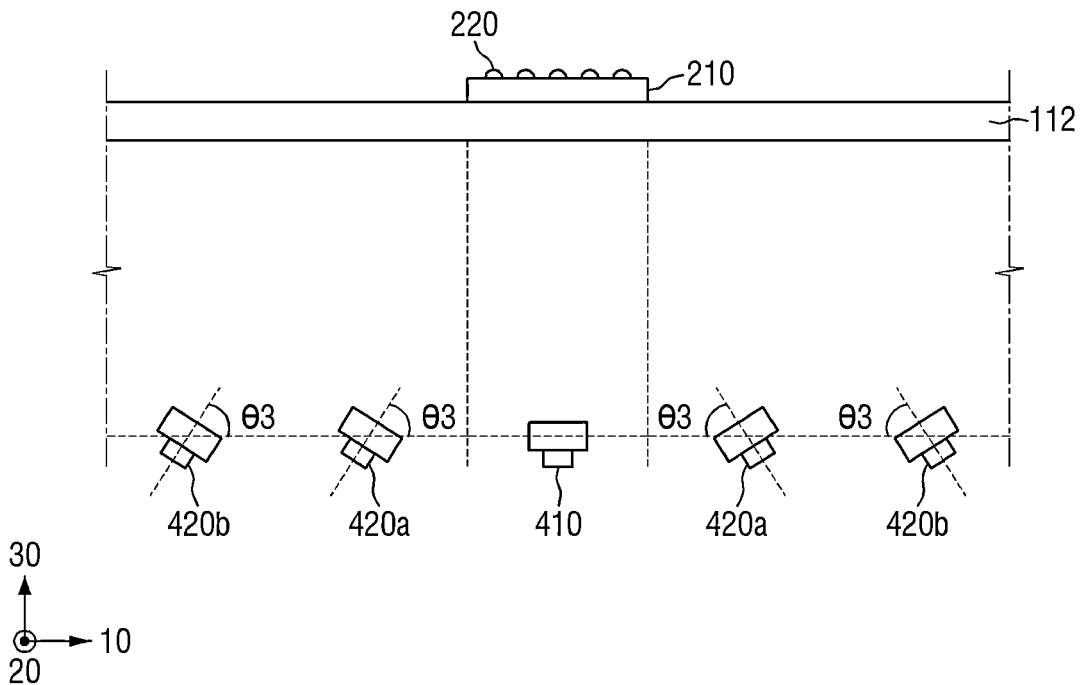
[FIG. 7]
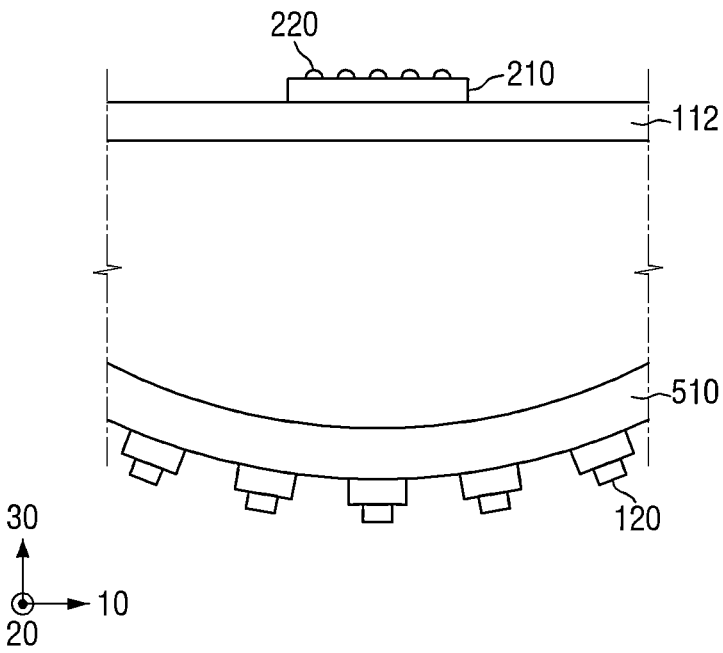

[FIG. 8]
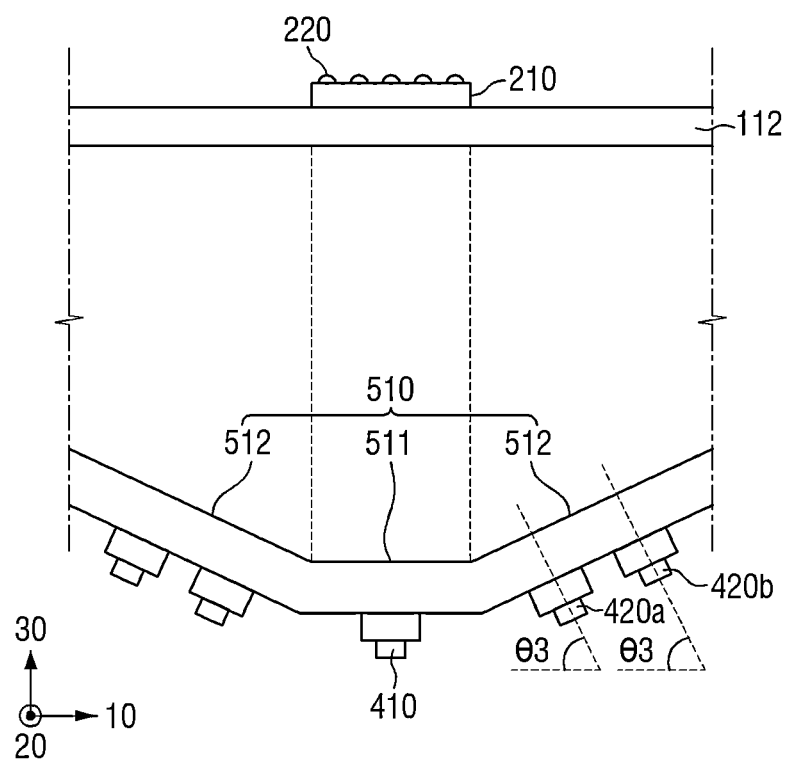

[FIG. 9]
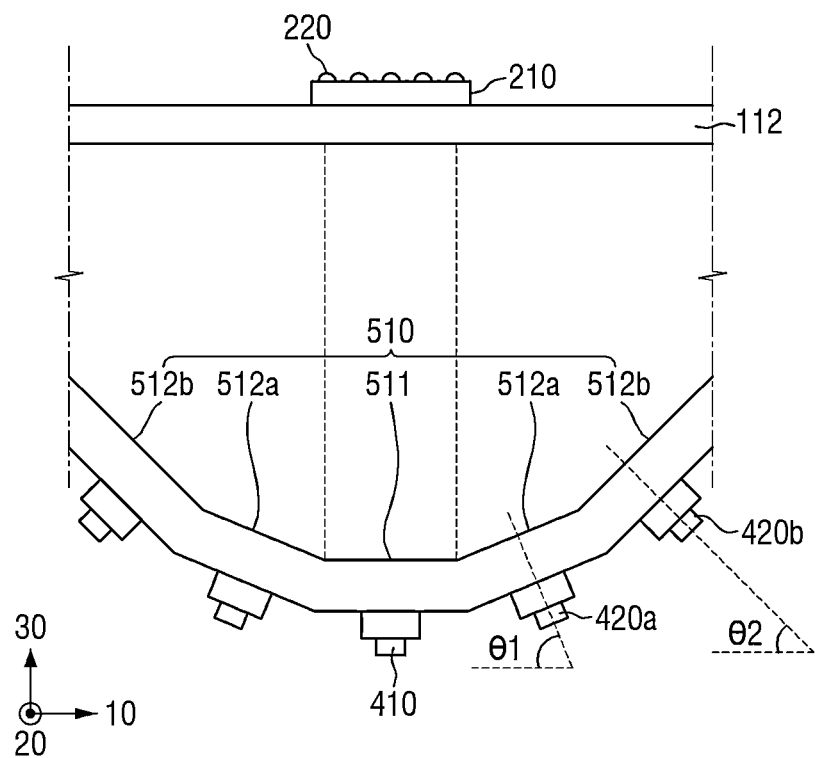

[FIG. 10]
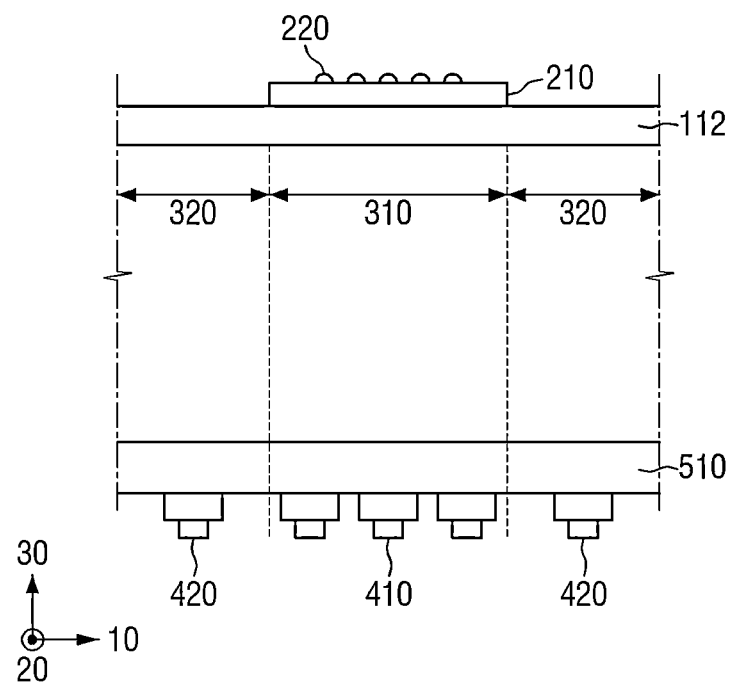

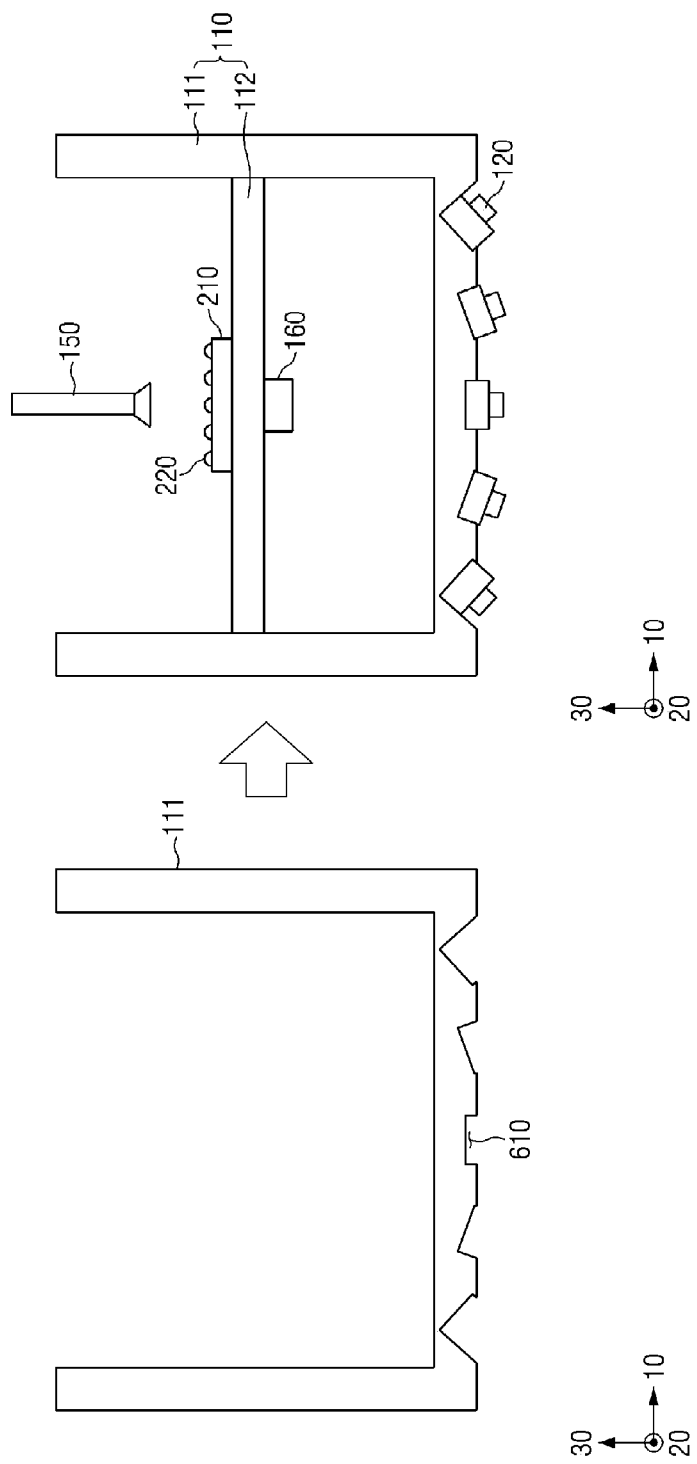
[FIG. 11]

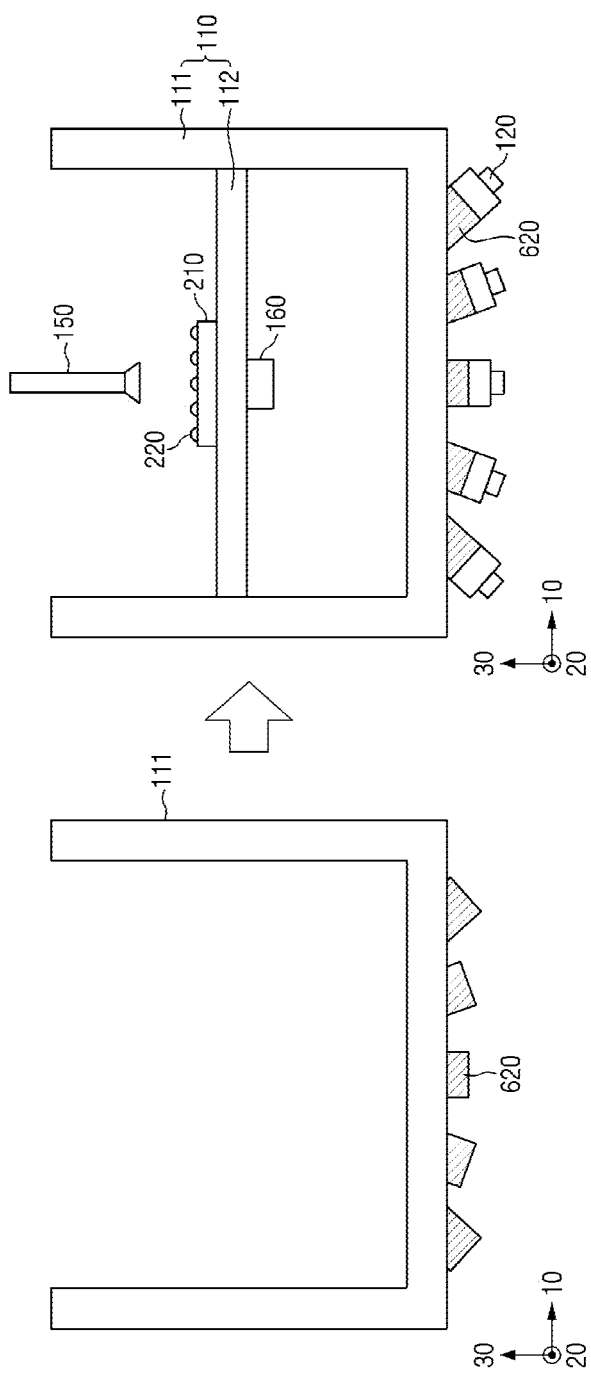
[FIG. 12]

[FIG. 13]
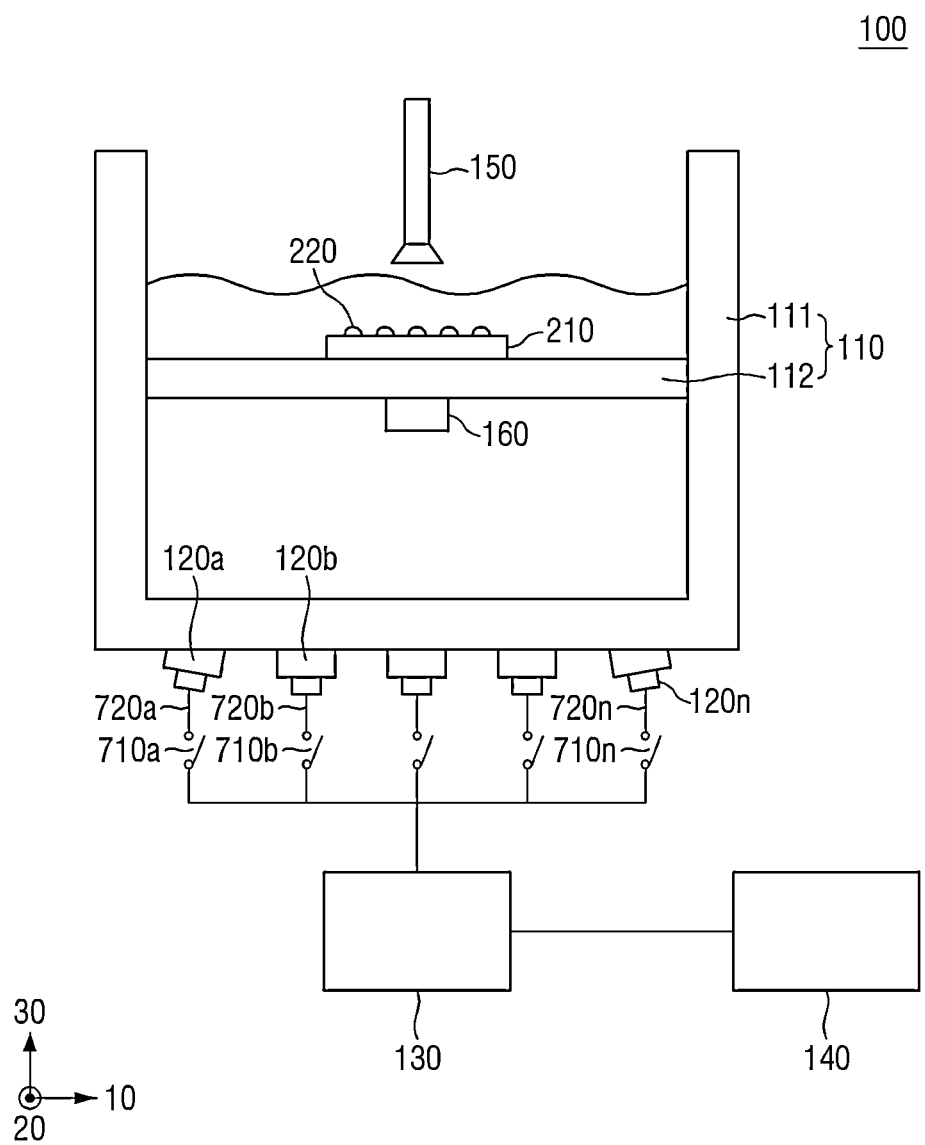

[FIG. 14]
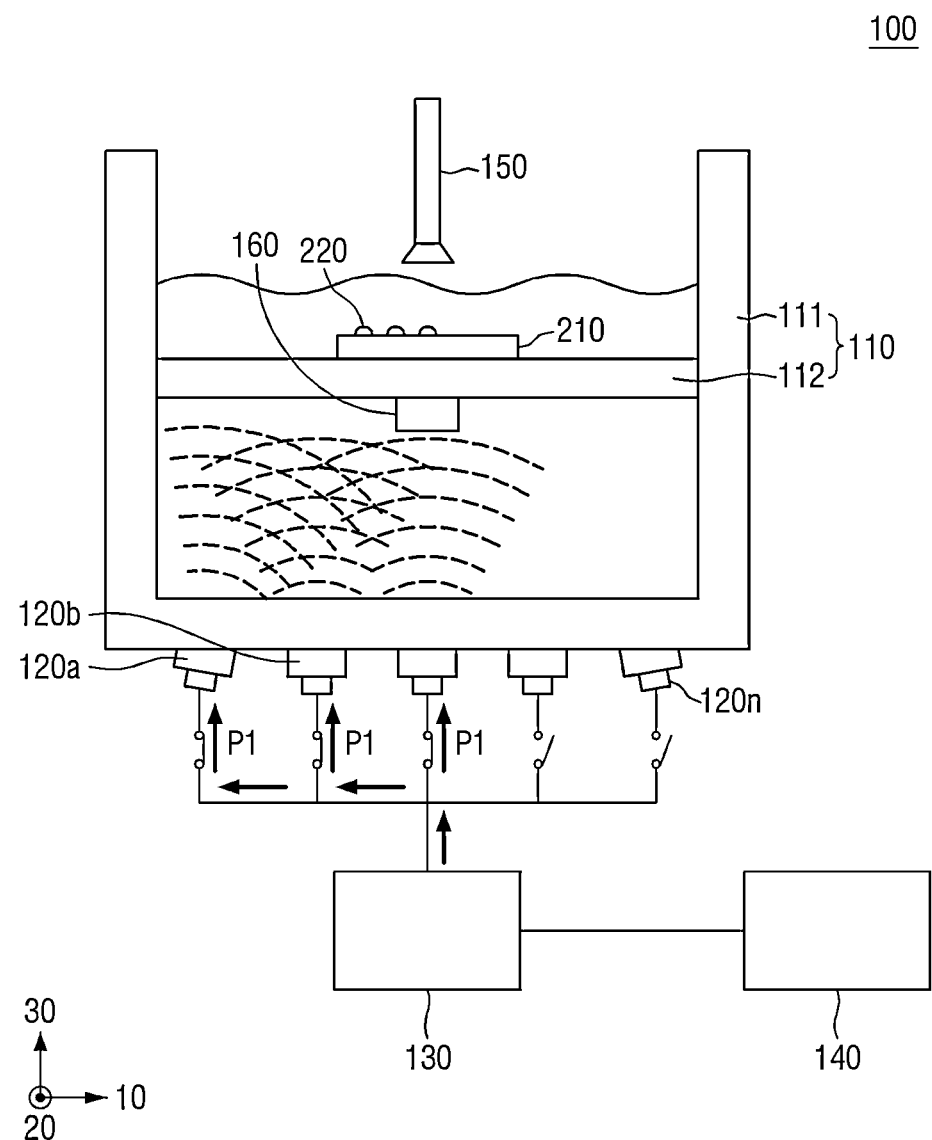

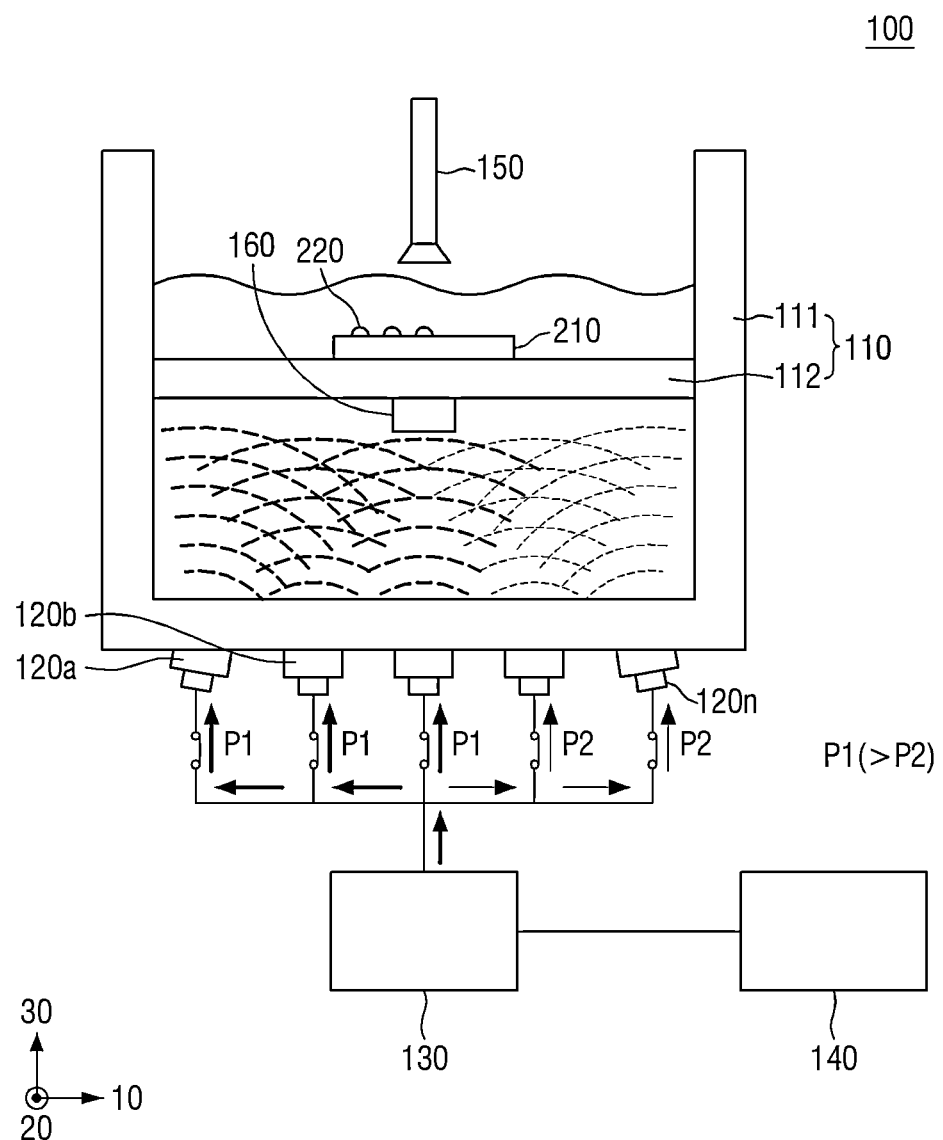
[FIG. 15]

APPARATUS AND METHOD FOR INSPECTING SEMICONDUCTOR

CROSS-REFERENCE TO RELATED APPLICATION

This application claims priority from Korean Patent Application No. 10-2021-0105879 filed on Aug. 11, 2021 in the Korean Intellectual Property Office and all the benefits accruing therefrom under 35 U.S.C. 119, the contents of which in its entirety are herein incorporated by reference.

BACKGROUND

1. Technical Field

The present disclosure relates to an apparatus and a method for inspecting a semiconductor product. More specifically, the present disclosure relates to an apparatus and a method for inspecting a semiconductor product, using an electromagnetic wave signal.

2. Description of the Related Art

When inspecting the semiconductor product, if bubbles are attached onto the semiconductor product, the inside of a portion to which the bubbles are attached may not be inspected properly, and it is also not possible to determine whether the semiconductor product is defective.

In the related art, although bubbles have been removed using a pipette, it takes a lot of time to remove the bubbles, and there is a limit to removing fine bubbles.

SUMMARY

Aspects of the present disclosure provide an apparatus and a method for inspecting a semiconductor capable of removing even fine bubbles in a short time.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an example embodiment of the present disclosure, there is provided an apparatus for inspecting a semiconductor, comprising a water tank including a housing, an interior of which is filled with a liquid, and a support block inside the housing and having a settling surface for an inspection object, a plurality of signal generators on a bottom surface of the housing, and each configured to output a frequency signal in a direction in which the inspection object is located, a power supply configured to provide power to the plurality of signal generators, a probe above the settling surface of the support block and configured to inspect the inspection object, and a receiver below a bottom surface of the support block and operable with the probe, wherein foreign matter remaining on the inspection object are removed, using a plurality of frequency signals output by the plurality of signal generators.

According to an example embodiment of the present disclosure, there is provided an apparatus for inspecting a semiconductor, comprising a water tank including a housing, an interior of which is filled with a liquid, and a support block inside the housing and having a settling surface for an inspection object, a plurality of signal generators on a bottom surface of the housing and each configured to output a frequency signal in a direction in which the inspection object is located, a power supply configured to provide power to the plurality of signal generators, a probe above the settling surface of the support block and configure to inspect the inspection object, and a receiver below a bottom surface of the support block and operable with the probe, wherein bubbles remaining on the inspection object are removed, using a plurality of ultrasonic signals output by the plurality of signal generators, the plurality of signal generators are installed on a bottom surface of the housing to have different inclinations in different directions from each other.

According to an example embodiment of the present disclosure, there is provided a method for inspecting a semiconductor, comprising preparing a water tank having a support block provided inside a housing, installing a plurality of signal generators on a bottom surface of the housing, installing a receiver below the support block; installing a probe above the support block, filling an interior of the housing with liquid, placing an inspection object on the support block, operating the plurality of signal generators to remove foreign matter remaining on the inspection object, and inspecting the inspection object, using the probe and the receiver.

The objects of the present disclosure are not limited to those mentioned above and additional objects of the present disclosure, which are not mentioned herein, will be clearly understood by those skilled in the art from the following description of the present disclosure.

BRIEF DESCRIPTION OF THE DRAWINGS

The above and other aspects and features of the present disclosure will become more apparent by describing in detail example embodiments thereof referring to the attached drawings, in which:

FIG. 1 is a diagram schematically showing a structure of a semiconductor inspecting apparatus according to an embodiment of the present disclosure;

FIG. 2 is an example diagram for explaining the performance of the semiconductor inspecting apparatus according to an embodiment of the present disclosure;

FIG. 3 is a first example drawing for explaining various arrangement structures of a signal generator constituting the semiconductor inspecting apparatus according to an embodiment of the present disclosure;

FIG. 4 is a second example diagram for explaining various arrangement structures of the signal generator constituting the semiconductor inspecting apparatus according to an embodiment of the present disclosure;

FIG. 5 is a third example diagram for explaining various arrangement structures of the signal generator constituting the semiconductor inspecting apparatus according to an embodiment of the present disclosure;

FIG. 6 is a fourth example diagram for explaining various arrangement structures of the signal generator constituting the semiconductor inspecting apparatus according to an embodiment of the present disclosure;

FIG. 7 is a first example diagram for explaining various shapes of a housing constituting the semiconductor inspecting apparatus according to an embodiment of the present disclosure;

FIG. 8 is a second example diagram for explaining various shapes of the housing constituting the semiconductor inspecting apparatus according to an embodiment of the present disclosure;

FIG. 9 is a third example diagram for explaining various shapes of the housing constituting the semiconductor inspecting apparatus according to an embodiment of the present disclosure;

FIG. 10 is a fifth example diagram for explaining various arrangement structures of the signal generator constituting the semiconductor inspecting apparatus according to the embodiment of the present disclosure;

FIG. 11 is a fourth example diagram for explaining various shapes of a housing constituting the semiconductor inspecting apparatus according to the embodiment of the present disclosure;

FIG. 12 is a fifth example diagram for explaining various shapes of a housing constituting the semiconductor inspecting apparatus according to the embodiment of the present disclosure;

FIG. 13 is a diagram schematically showing the structure of a semiconductor inspecting apparatus according to another embodiment of the present disclosure;

FIG. 14 is a first example diagram for explaining a method for operating the semiconductor inspecting apparatus according to still another embodiment of the present disclosure; and FIG. 15 is a second example diagram for explaining a method for operating the semiconductor inspecting apparatus according to another embodiment of the present disclosure.

DETAILED DESCRIPTION OF THE EMBODIMENTS

Hereinafter, some embodiments of the present disclosure will be described in detail referring to the accompanying drawings. Same constituent elements on the drawings are denoted by the same reference numerals, and repeated descriptions thereof will not be provided.

The present disclosure relates to an apparatus and a method for inspecting a semiconductor capable of removing bubbles on a semiconductor product for inspecting the semiconductor product. In particular, the present disclosure relates to an apparatus and a method for inspecting a semiconductor capable of removing even fine bubbles in a short time. Hereinafter, the present disclosure will be described in detail referring to the drawings and the like.

FIG. 1 is a diagram schematically showing the structure of a semiconductor inspecting apparatus according to an embodiment of the present disclosure.

According to FIG. 1, a semiconductor inspecting apparatus 100 may be configured to include a water tank 110, a signal generator 120, a power supply 130, a power control 140, a probe 150, and a receiver 160.

The semiconductor inspecting apparatus 100 is an apparatus capable of removing foreign matter 220 remaining on the semiconductor product 210 to inspect the semiconductor product 210. Such a semiconductor inspecting apparatus 100 may remove the foreign matter 220 on the semiconductor product 210, using an electromagnetic wave signal. The semiconductor inspecting apparatus 100 may remove the foreign matter 220 on the semiconductor product 210, for example, using an ultrasonic signal.

The water tank 110 provides a space for inspecting the semiconductor product 210. The interior of such a water tank 110 may be filled with a liquid (e.g., DI water), and may include a housing 111 and a support block 112.

The support block 112 provides a settling surface for the semiconductor product 210 placed inside the housing 111 for inspection. Such a support block 112 may be fixed to inner walls of the housing 111, and both the support block 112 and the semiconductor product 210 may be immersed in a liquid.

On the other hand, the housing 111 may be formed so that its upper portion is openable or closable for inputting an apparatus for inspecting the semiconductor product 210. The housing 111 and the support block 112 may be made of, for example, a PVC material.

The signal generator 120 generates an electromagnetic wave signal of a specific frequency band. A plurality of such signal generators 120 may be installed on a bottom surface of the water tank 110 to output electromagnetic wave signals of a specific frequency band in a direction in which the semiconductor product 210 is located.

The signal generator 120 may generate an electromagnetic wave signal of a high frequency band in the direction in which the semiconductor product 210 is located. The signal generator 120 may generate, for example, an ultrasonic signal in the direction in which the semiconductor product 210 is located.

When the ultrasonic signal 230 is generated in the direction in which the semiconductor product 210 is located, using the signal generator 120 as shown in FIG. 2 in a state in which the semiconductor product 210 is placed on the support block 112 in the housing 111, numerous minute resonances may be generated and dissipate, and a cavitation phenomenon in which energy of the ultrasonic signal 230 is expanded hundreds of thousands to millions of times may occur inside the housing 111.

In the present embodiment, an organic matter 240 remaining in the semiconductor product 210 can be removed by utilizing such a cavitation phenomenon, and even the fine bubbles 250 adhering to the semiconductor product 210 can also be removed. FIG. 2 is an example diagram for explaining the performance of the semiconductor inspecting apparatus according to an embodiment of the present disclosure.

On the other hand, when the signal generator 120 generates an ultrasonic signal, it may be provided as, for example, an ultrasonic vibrator. In order to effectively remove the organic matter 240 and the fine bubbles 250 remaining in the semiconductor product 210, the signal generator 120 may generate an electromagnetic wave signal having an oscillation frequency, for example, in range of 20 KHz to 100 KHz during an operating time of 1 to 30 seconds.

On the other hand, the plurality of signal generators 120 may be installed on the bottom surface of the water tank 110 with different inclinations to concentrate the electromagnetic wave signals in the direction in which the semiconductor product 210 is located. The plurality of signal generators 120 may have an inclination of, for example, 0 to 30 degrees to effectively remove the organic matter 240 and the fine bubbles 250 remaining in the semiconductor product 210.

A more detailed description will be provided later referring to the drawings in relation to the installation form of the plurality of signal generators 120.

This will be described again referring to FIG. 1.

The power supply 130 supplies power to the signal generator 120 so that the signal generator 120 may operate. The power supply 130 may be provided as, for example, an ultrasonic generator.

The power control 140 controls the power supply 130 so that the power supply 130 may supply power to the signal generator 120. The power control 140 may be provided, for example, as a microprocessor or a computer equipped with the microprocessor.

The probe 150 and the receiver 160 inspect the semiconductor product 210. The probe 150 and the receiver 160 may therefore be installed at positions corresponding to each other, on the basis of the semiconductor product 210. For example, the probe 150 may be placed above the semiconductor product 210 and the receiver 160 may be attached to the bottom surface of the support block 112.

The probe 150 and the receiver 160 may inspect the semiconductor product 210, using signals of a specific frequency band. The probe 150 and the receiver 160 may inspect the semiconductor product 210 using, for example, an ultrasonic signal.

The receivers 160 may be provided inside the semiconductor inspecting apparatus 100 by the same number as that of the probes 150. For example, both the probe 150 and the receiver 160 may be installed by a single number inside the semiconductor inspecting apparatus 100. However, this embodiment is not limited thereto. The number of receivers 160 installed in the semiconductor inspecting apparatus 100 may be more than that of the probes 150. For example, the single probe 150 may be installed in the semiconductor inspecting apparatus 100, and a plurality of receivers 160 may be installed in the semiconductor inspecting apparatus 100.

Next, various arrangement structures of a plurality of signal generator 120 that are applicable for concentrating the electromagnetic wave signal in the direction in which the semiconductor product 210 is located will be described.

The semiconductor product 210 may be placed in a center region on the support block 112. In the following description, as shown in FIG. 3, a region corresponding to the region in which the semiconductor product 210 is installed on the bottom surface of the housing 111 will be defined as a first region 310, and a region corresponding to the region other than the region in which the semiconductor product 210 is installed will be defined as a second region 320. FIG. 3 is a first example drawing for explaining various arrangement structures of the signal generator constituting the semiconductor inspecting apparatus according to an embodiment of the present disclosure.

The plurality of signal generators 120 may be installed in the first region 310 on the bottom surface of the housing 111, and may also be installed in the second region 320. In the following description, the signal generator 120 installed in the first region 310 will be defined as a first signal generating module 410, and the signal generator 120 installed in the second region 320 will be defined as a second signal generating module 420.

As shown in FIG. 4, the first signal generating module 410 may be installed in a direction parallel to a height direction, that is, a third direction 30 of the housing 111. On the other hand, the second signal generating module 420 may be installed in a state of being inclined by a predetermined angle θ with respect to the height direction 30 of the housing 111.

The second signal generating module 420 may be provided to be directed to the direction in which the semiconductor product 210 is located to concentrate the ultrasonic signal in the direction in which the semiconductor product 210 is located. For example, the second signal generating module 420 placed at a left lower part of the semiconductor product 210 may be installed in a state of being inclined by a predetermined angle toward a right upper part in which the semiconductor product 210 is located. The second signal generating module 420 placed at the right lower part of the semiconductor product 210 may be installed in a state of being inclined by a predetermined angle toward the left upper part in which the semiconductor product 210 is located. FIG. 4 is a second example diagram for explaining various arrangement structures of the signal generator constituting the semiconductor inspecting apparatus according to an embodiment of the present disclosure.

As shown in FIG. 5, a plurality of second signal generating modules 420 may be placed in a row in a direction away from the first signal generating module 410. In this case, the plurality of second signal generating modules 420 may be inclined at different angles $\theta_1$ and $\theta_2$ from each other, depending on a distance difference to the first signal generating module 410.

For example, when the second signal generating module 420a relatively close to the first signal generating module 410 is inclined at the first angle $\theta_1$, and the second signal generating module 420b relatively distant from the first signal generating module 410 is inclined at the second angle $\theta_2$, the first angle $\theta_1$ may have a value greater than the second angle $\theta_2$ ($\theta_1 > \theta_2$). FIG. 5 is a third example diagram for explaining various arrangement structures of the signal generator constituting the semiconductor inspecting apparatus according to an embodiment of the present disclosure.

On the other hand, the plurality of second signal generating modules 420a and 420b may also be inclined at a same angle $\theta_3$ as shown in FIG. 6, regardless of the distance difference to the first signal generating module 410. FIG. 6 is a fourth example diagram for explaining various arrangement structures of the signal generator constituting the semiconductor inspecting apparatus according to an embodiment of the present disclosure.

On the other hand, in the present embodiment, both the first signal generating module 410 and the second signal generating module 420 may also be installed on the bottom surface of the housing 111 at the same angle. For example, the first signal generating module 410 and the second signal generating module 420 may be installed in a direction parallel to the height direction 30 of the housing 111 (that is, a direction perpendicular to the bottom surface of the housing 111).

On the other hand, the plurality of signal generators 120 may be provided only in the first region 310 on the bottom surface of the housing 111, or may be provided only in the second region 320.

As described above, various arrangement structures of the plurality of signal generators 120 have been described referring to FIGS. 3 to 6. Such various arrangement structures of the signal generator 120 may be formed depending on the shape of the bottom surface of the housing 111.

For example, when the bottom surface 510 of the housing 111 is formed in a round shape as shown in FIG. 7, the first signal generating module 410 may be installed in a direction parallel to the height direction 30 of the housing 111, and the second signal generating module 420 may be installed in a state of being inclined by a predetermined angle θ with respect to the height direction 30 of the housing 111. FIG. 7 is a first example diagram for explaining various shapes of the housing constituting the semiconductor inspecting apparatus according to an embodiment of the present disclosure.

Further, as shown in FIG. 8, a first bottom surface part 511 of the housing 111 corresponding to the first region 310 is formed to extend in a direction parallel to the longitudinal direction of the semiconductor product 210. A second bottom surface part 512 of the housing 111 corresponding to the second region 320 may be formed to extend at a predetermined angle to be directed to the direction in which the semiconductor product 210 is located.

In this case, the plurality of second signal generating modules 420a and 420b placed in a row in a direction away from the first signal generating module 410 may be inclined at the same angle $\theta_3$ regardless of the distance difference to the first signal generating module 410. FIG. 8 is a second example diagram for explaining various shapes of the housing constituting the semiconductor inspecting apparatus according to an embodiment of the present disclosure.

Alternatively, the second bottom surface part 512 of the housing 111 may be divided into a plurality of modules 512a and 512b inclined at different angles from each other as shown in FIG. 9 so that the plurality of second signal generating modules 420a and 420b are inclined at different angles $\theta_1$ and $\theta_2$ from each other depending on the distance difference to the first signal generating module 410. FIG. 9 is a third example diagram for explaining various shapes of the housing constituting the semiconductor inspecting apparatus according to an embodiment of the present disclosure.

On the other hand, the bottom surface 510 of the housing 111 may also be formed in a flat structure. In this case, as shown in FIG. 10, it is also possible to place the number of the first signal generating modules 410 to be larger than the number of the second signal generating modules 420 so that a large amount of electromagnetic wave signals is output in the direction in which the semiconductor product 210 is located. FIG. 10 is a fifth example diagram for explaining various arrangement structures of the signal generator constituting the semiconductor inspecting apparatus according to the embodiment of the present disclosure.

Alternatively, as shown in FIG. 11, a groove 610 may be formed on the bottom surface 510 of the housing 111 to install the first signal generating module 410 and the second signal generating module 420 having different inclination values from each other. FIG. 11 is a fourth example diagram for explaining various shapes of the housing constituting the semiconductor inspecting apparatus according to the embodiment of the present disclosure.

Alternatively, as shown in FIG. 12, a bracket 620 may be installed on the bottom surface 510 of the housing 111 to install the first signal generating module 410 and the second signal generating module 420 having different inclination values from each other. The bracket 620 is directionally adjustable and may adjust the first signal generating module 410 and the second signal generating module 420 in the direction in which the semiconductor product 210 is located. FIG. 12 is a fifth example diagram for explaining various shapes of the housing constituting the semiconductor inspecting apparatus according to the embodiment of the present disclosure.

On the other hand, foreign matters 220 (e.g., bubbles) may remain on a part of the semiconductor product 210. This will be described below.

FIG. 13 is a diagram schematically showing the structure of a semiconductor inspecting apparatus according to another embodiment of the present disclosure.

According to FIG. 13, the semiconductor inspecting apparatus 100 may be configured to include a water tank 110, a signal generator 120, a power supply 130, a power control 140, a probe 150, a receiver 160, and a switching element 710.

Because the water tank 110, the signal generator 120, the power supply 130, the power control 140, the probe 150, and the receiver 160 have been described above referring to FIGS. 1 to 12, the detailed description thereof will not be provided here.

The switching element 710 may be provided on a power line 720 that connects the power supply 130 and the signal generator 120. Such switching elements 710 are provided by the numbers (710a, 710b, . . . , 710n) corresponding to the number of signal generators 120, and may be installed on each of the power lines 720a, 720b, . . . , 720n which connect the power supply 130 and the plurality of signal generators 120a, 120b, . . . , 120n. The switching elements 710a, 710b, . . . , 710n may be turned on/off by the power control 140.

Even when the foreign matter 220 remains on a part of the semiconductor product 210, all the switching elements 710a, 710b, . . . , 710n are set to a closed state so that all the plurality of signal generators 120a, 120b, . . . , 120n may operate. However, the present embodiment is not limited thereto. Some switching elements among the plurality of switching elements 710a, 710b, . . . , 710n are set to a closed state so that some signal generators among the plurality of signal generators 120a, 120b, . . . , 120n may operate.

For example, when the foreign matter 220 remains on the left side of the semiconductor product 210 as shown in FIG. 14, the first switching element 710a, the second switching element 710b, and the third switching element 710c are set to a closed state so that the electromagnetic wave signal may be output toward the left direction of the semiconductor product 210. FIG. 14 is a first example diagram for explaining a method for operating the semiconductor inspecting apparatus according to another embodiment of the present disclosure.

Alternatively, the first switching element 710a to the $n^{th}$ switching element 710n are all set to the closed state so that more amount of power than other power lines may be supplied to the first power line 720a, the second power line 720b, and the third power line 720c as shown in FIG. 15 ($P_1 > P_2$). FIG. 15 is a second example diagram for explaining a method for operating the semiconductor inspecting apparatus according to another embodiment of the present disclosure.

On the other hand, whether the foreign matter 220 remains on a part of the semiconductor product 210 may be discriminated, using image information obtained by photographing the semiconductor product 210. In the present embodiment, for example, it is possible to discriminate whether the foreign matter 220 remains on a part of the semiconductor product 210, on the basis of the image information obtained using the probe 150 and the receiver 160.

Next, a method for removing the foreign matter 220 on the semiconductor product 210 using the semiconductor inspecting apparatus 100 will be described.

First, the water tank 110 having the support block 112 installed inside the housing 111 is prepared.

After that, a plurality of signal generators 120 are installed on the bottom surface of the housing 111.

After that, the semiconductor product 210 is placed on the support block 112, and then the probe 150 and the receiver 160 are placed above and below the semiconductor product 210, respectively. Then, the interior of the housing 111 is filled with a liquid.

After that, the power control 140 controls the power supply 130 so that each signal generator 120 operates.

After a predetermined time has elapsed, the semiconductor product 210 is inspected, using the probe 150 and the receiver 160.

On the other hand, in the present embodiment, before operating each signal generator 120, the semiconductor product 210 may be photographed to discriminate whether the foreign matter 220 remains on a part of the semiconductor product 210.

The semiconductor inspecting apparatus 100 is an ultrasonic flaw detection inspecting apparatus used in a semiconductor, and may obtain the effect of removing even fine bubbles in a short time through the structure described referring to FIGS. 1 to 15. The semiconductor inspecting apparatus 100 can shorten the bubble removal time (reduced from 20 minutes to 10 seconds) as compared with a case of removing bubbles using a conventional pipette, and even in its performance, it is also possible to remove fine bubbles, and an excellent bubble removal improvement effect can be obtained. That is, the semiconductor inspecting apparatus 100 may be widely applied to the semiconductor fabricating field in which the bubble removal is required, and it is also possible to obtain various effects such as bubble removal work efficiency, inspection consistency, and error improvement.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic, a microprocessor, application-specific integrated circuit (ASIC), etc.

In concluding the detailed description, those skilled in the art will appreciate that many variations and modifications may be made to the preferred embodiments without substantially departing from the principles of the present disclosure. Therefore, the disclosed preferred embodiments of the present disclosure are used in a generic and descriptive sense only and not for purposes of limitation.

What is claimed is:

1. An apparatus for inspecting a semiconductor, the apparatus comprising:
   a water tank including a housing, an interior of which is filled with a liquid, and a support block inside the housing and having a settling surface for an inspection object;
   a plurality of signal generators on a bottom surface of the housing, and configured to output a frequency signal in a direction in which the inspection object is located;
   a power supply configured to supply power to the signal generator;
   a probe above the settling surface of the support block and configured to inspect the inspection object using signals of a specific frequency; and
   a receiver attached to a bottom surface of the support block and operable with the probe,
   wherein foreign matter remaining on the inspection object are removed, using a plurality of frequency signals output by the plurality of signal generators.

2. The apparatus of claim 1, wherein the plurality of signal generators are configured to have different inclinations from each other.

3. The apparatus of claim 2, wherein the plurality of signal generators are inserted into a groove formed on the bottom surface of the housing.

4. The apparatus of claim 3, wherein the groove formed on the outside of the bottom surface has an inclination different from the groove formed on the inside of the bottom surface.

5. The apparatus of claim 2, wherein the plurality of signal generators are mounted to a bracket on the bottom surface of the housing.

6. The apparatus of claim 1, wherein the plurality of signal generators include:
   a first signal generating module on a first bottom surface part of the housing; and
   a second signal generating module on a second bottom surface part of the housing,
   wherein the first bottom surface part is in a first region corresponding to an installation region of the inspection object.

7. The apparatus of claim 6, wherein the second signal generating module has an inclination different from that of the first signal generating module.

8. The apparatus of claim 6, wherein the second signal generating module is one of a plurality of second signal generating modules, and
   the plurality of second signal generating modules are inclined in different directions from each other.

9. The apparatus of claim 6, wherein the second signal generating module is one of a plurality of second signal generating modules that are in a row in a direction spaced away from the first signal generating module.

10. The apparatus of claim 9, wherein the plurality of second signal generating modules are inclined at different angles from each other, dependent on a distance difference to the first signal generating module.

11. The apparatus of claim 10, wherein ones of the plurality of second signal generating modules spaced further from the first signal generating module are inclined at a greater angle than ones of the plurality of second signal generating modules that are closer to the first signal generating module.

12. The apparatus of claim 6, wherein a number of first signal generating modules is greater than that of a number of second signal generating modules.

13. The apparatus of claim 1, further comprising:
    a plurality of power lines connect the power supply and each of the plurality of signal generators, and
    a plurality of switching elements in each power line.

14. The apparatus of claim 13, wherein a controller is configured to open and close the plurality of switching elements depending on a position of the foreign matter.

15. The apparatus of claim 13, wherein the plurality of power lines have different amounts of power depending on the position of the foreign matter.

16. The apparatus of claim 1, wherein the foreign matter is a bubble.

17. The apparatus of claim 1, wherein the frequency signal is one of an ultrasonic signal, and
    a range of the frequency signal is 20 KHz to 100 KHz.

18. The apparatus of claim 1, wherein the plurality of signal generators are installed on the bottom surface of the housing to have an inclination of 0 to 30 degrees.

19. An apparatus for inspecting a semiconductor, the apparatus comprising:
    a water tank including a housing, an interior of which is filled with a liquid, and a support block inside the housing and having a settling surface for an inspection object;
    a plurality of signal generators on a bottom surface of the housing and configured to output a frequency signal in a direction in which the inspection object is located;
    a power supply configured to supply power to the signal generator;
    a probe above the settling surface of the support block and configured to inspect the inspection object using signals of a specific frequency; and
    a receiver attached to a bottom surface of the support block and operable with the probe, wherein bubbles remaining on the inspection object are removed, using a plurality of ultrasonic frequency signals that are output by the plurality of signal generators, the plurality of signal generators are on a bottom surface of the housing at different inclinations in different directions from each other.

20. A method for inspecting a semiconductor, the method comprising:

preparing a tank having a support block provided inside a housing;

installing a plurality of signal generators on a bottom surface of the housing;

installing a receiver to a bottom of the support block;

installing a probe above the support block;

filling an interior of the housing with liquid;

placing an inspection object on the support block;

operating the plurality of signal generators to remove foreign matter remaining on the inspection object; and inspecting the inspection object, using the probe to emit signals of a specific frequency and receiving the signals by the receiver.

* * * * *